(12) United States Patent
Lee

(10) Patent No.: US 10,079,176 B2
(45) Date of Patent: *Sep. 18, 2018

(54) METHOD OF USING A BARRIER-SEED TOOL FOR FORMING FINE PITCHED METAL INTERCONNECTS

(71) Applicant: Taiwan Semiconductor Manufacturing Co., Ltd., Hsin-Chu (TW)

(72) Inventor: Ya-Lien Lee, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/212,306

(22) Filed: Jul. 18, 2016

(65) Prior Publication Data

US 2016/0358814 A1    Dec. 8, 2016

Related U.S. Application Data

(63) Continuation of application No. 14/196,268, filed on Mar. 4, 2014, now Pat. No. 9,396,992.

(51) Int. Cl.
| | | |
|---|---|---|
| *H01L 21/768* | (2006.01) | |
| *H01L 21/02* | (2006.01) | |
| H01L 21/3213 | (2006.01) | |
| *H01J 37/32* | (2006.01) | |
| *H01L 23/522* | (2006.01) | |
| *H01L 23/528* | (2006.01) | |
| *H01L 23/532* | (2006.01) | |

(52) U.S. Cl.
CPC .. *H01L 21/76862* (2013.01); *H01J 37/32422* (2013.01); *H01J 37/32706* (2013.01);
(Continued)

(58) Field of Classification Search
CPC ......... H01L 45/1683; H01L 2221/1015; H01L 2224/05006; H01L 2224/05546; H01L 21/76807
See application file for complete search history.

(56) References Cited

U.S. PATENT DOCUMENTS 6,395,642 B1 * 5/2002 Liu .......................... C25D 5/34
                                                              438/720
6,800,494 B1   10/2004 Castle et al.
(Continued)

OTHER PUBLICATIONS

Wafer. (n.d.) Random House Kernerman Webster's College Dictionary. (2010). Retrieved Jun. 22, 2017 from http://www.thefreedictionary.com/wafer.*

(Continued)

*Primary Examiner* — Jay C Chang
*Assistant Examiner* — Mikka Liu
(74) *Attorney, Agent, or Firm* — Eschweiler & Potashnik, LLC

(57) ABSTRACT

A barrier seed tool is configured to clean trenches in a first chamber, line the trenches with a diffusion barrier layer, and form a copper seed layer over the diffusion barrier layer in a second chamber. The clean chamber is configured to reduce overhangs in the copper seed layer by producing a plasma comprising positively and negatively charged ions including halogen ions, filtering the plasma to selectively exclude positively charged ions, and bombarding with the filtered plasma. The tool and related method can be used to reduce overhangs and improve subsequent gap fill while avoiding excessive damage to the dielectric matrix.

20 Claims, 5 Drawing Sheets

(52) U.S. Cl.
CPC .. *H01L 21/02063* (2013.01); *H01L 21/32136* (2013.01); *H01L 21/7681* (2013.01); *H01L 21/7684* (2013.01); *H01L 21/76802* (2013.01); *H01L 21/76814* (2013.01); *H01L 21/76816* (2013.01); *H01L 21/76843* (2013.01); *H01L 21/76865* (2013.01); *H01L 21/76871* (2013.01); *H01L 21/76873* (2013.01); *H01L 21/76879* (2013.01); *H01L 23/528* (2013.01); *H01L 23/5226* (2013.01); *H01L 23/53238* (2013.01); *H01L 21/02068* (2013.01)

(56) References Cited

U.S. PATENT DOCUMENTS

| | | | |
|---|---|---|---|
| 8,193,075 B2 | 6/2012 | Xu | |
| 2005/0260851 A1* | 11/2005 | Huang | H01L 21/2855 438/643 |
| 2009/0181164 A1 | 7/2009 | Wang et al. | |
| 2009/0209106 A1* | 8/2009 | Su | H01L 21/2855 438/696 |

OTHER PUBLICATIONS

Dulkin, et al. "Improving the Quality of PVD Cu Seed Layer." Retrieved from Semiconductor Manufacturing & Design Community. Published on Jan. 23, 2012. 20 Pages.

Lam Research Corporation. "Novellus Systems Launches INOVA NExT with HCM IONX for 32nm PVD Copper Barrier/Seed Extendibility." Published on Jul. 16, 2007. 2 Pages.

Non-Final Office Action dated Oct. 22, 2015 for U.S. Appl. No. 14/196,268.

Notice of Allowance dated Mar. 21, 2016 for U.S. Appl. No. 14/196,268.

* cited by examiner

METHOD OF USING A BARRIER-SEED TOOL FOR FORMING FINE PITCHED METAL INTERCONNECTS

REFERENCE TO RELATED APPLICATION

This Application is a Continuation of U.S. application Ser. No. 14/196,268 filed on Mar. 4, 2014, the contents of which is hereby incorporated by reference in its entirety

BACKGROUND

The present disclosure relates to integrated circuit (IC) device manufacturing processes and processing equipment.

Many years of research have been devoted to reducing the critical dimensions (CDs) and structure densities of ICs. As densities have increased, the resistance capacitance (RC) delay time has become a limiting factor in circuit performance. RC delay can be reduced by forming metal interconnect structures using copper (Cu) in place of aluminum and low-k or extremely low-k dielectrics in place of silicon dioxide.

Cu metal interconnect structures are typically formed by damascene processes. As the term is used in the present disclosure, a "damascene process" can be a dual damascene process. In a typical damascene process, a desired pattern of holes and trenches is etched into a dielectric. The holes and trenches are then filled with copper to form conductive vias and lines. Filling with copper typically includes the steps of cleaning the trenches, depositing a diffusion barrier layer, and depositing a copper seed layer. Copper barrier-seed tools adapted to perform these steps in situ are now commercially available.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
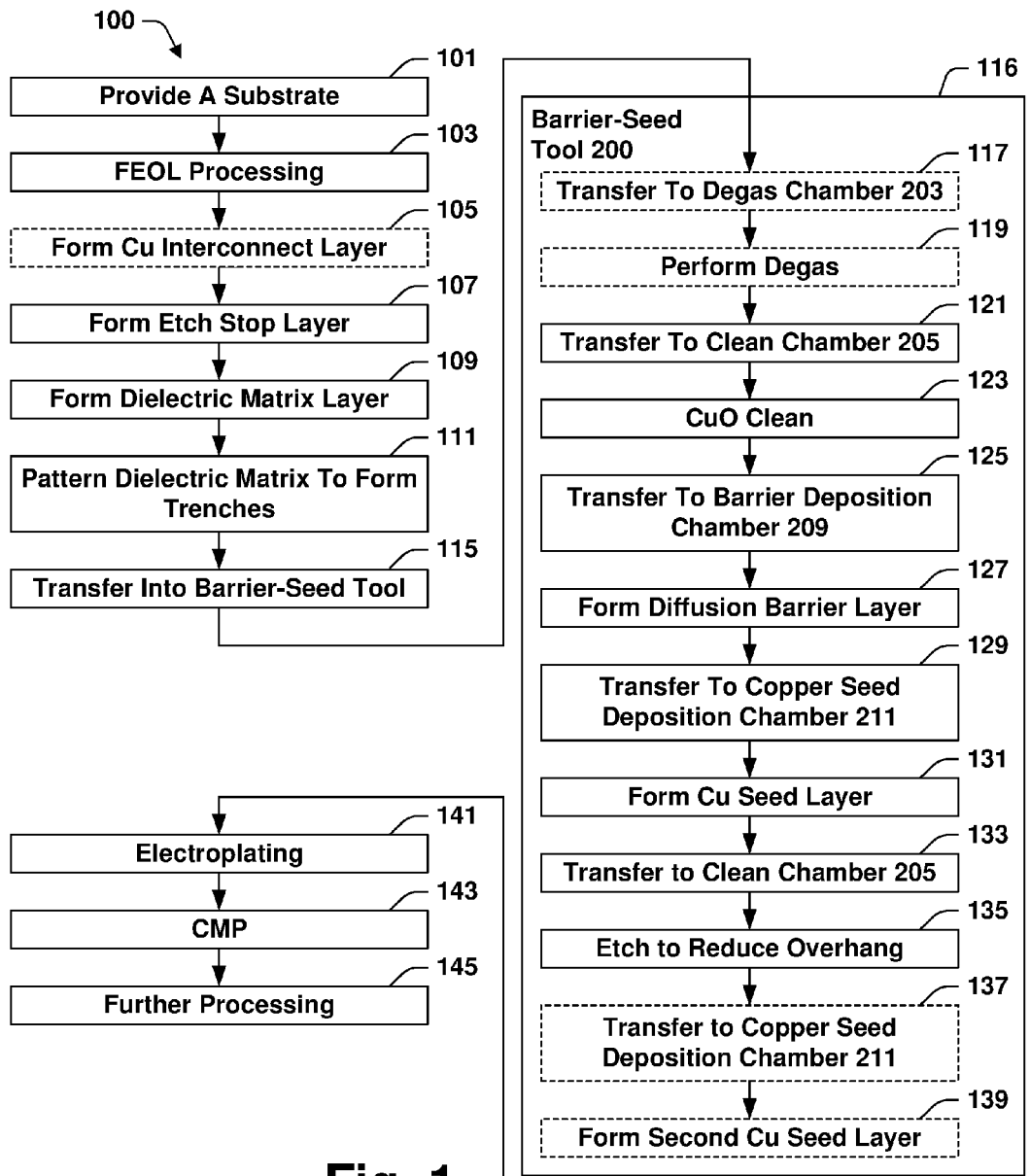
FIG. 1 is a flow chart of a method in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It has been observed that the copper seed layer formed by a typical copper barrier layer and copper seed layer deposition (barrier-seed) tool tends to form overhangs proximate the entrances (openings) of trenches and holes. When critical dimensions are 32 nm or less, these overhangs tend to be significant in the sense of materially diminishing the quality of gap fill from subsequent electroplating. A typical barrier-seed tool will have a copper seed layer deposition chamber that can perform an ion bombardment with Ar or Cu that is effective for reducing these overhangs. But it has been observed that ion bombardment of this type can damage low-k dielectrics.

The present disclosure provides an alternative method for reducing the overhang in a barrier-seed tool and provides a barrier-seed tool adapted to implement that method. A cleaning chamber of the tool is supplied with process gases and an ion filter enabling the overhang to be etched quickly and in a selective manner using low energy halogen ions.

FIG. 1 is a flow chart of a process 100 that provides an example according to one embodiment of the present disclosure. The process 100 includes a series of actions 116 that are performed in a barrier-seed tool 200 such as the one illustrated in FIG. 2. Action 116 are the focus of this example. Actions of process 100 that are performed before or after actions 116 can be varied widely without departing from the scope of the present disclosure. FIGS. 5-14 illustrate an example integrated circuit device 300 being manufactured using the process 100.

Process 100 begins with action 101, providing a wafer 229 that includes a substrate 301 for device 300. Process 100 continues with action 103, putting wafer 229 including substrate 301 through front-end-of-line (FEOL) processing. Substrate 301 can be any type of substrate suitable for integrated circuit devices. Substrate 301 includes a semiconductor. FEOL processing 103 can modify substrate 301 to include various structures and integrated circuit component devices.

Figures 5, 6:
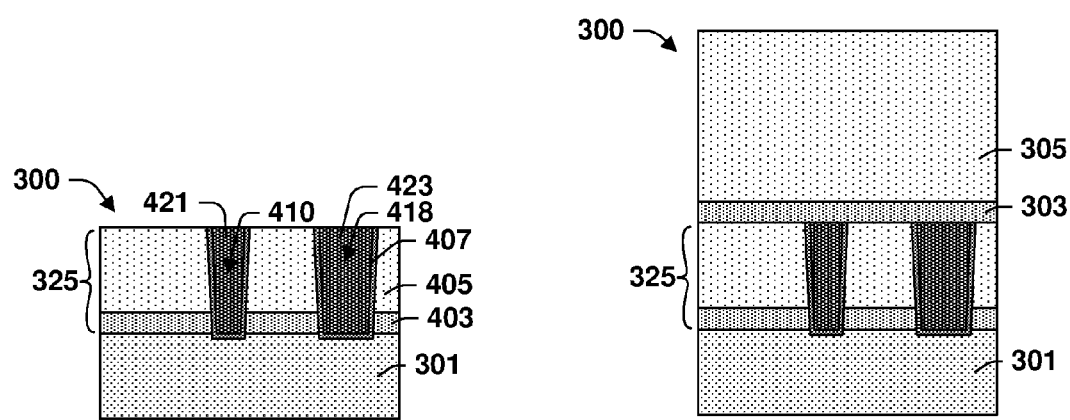
FIGS. 5-14 illustrate a device 300 at various intermediate stages of manufacture as it goes through processing by the method of FIG. 1.

Process 100 continues with action 105, modifying substrate 301 to include a first metal-interconnect layer 325 as shown in FIG. 5. First metal-interconnect layer 325 includes a cap layer 403, a dielectric layer 405, conductive lines 421, and vias 423. Holes 418 and trenches 410 within dielectric layer 405 are lined with a copper diffusion barrier layer 407 and filled with copper to form conductive lines 421 and vias 423. Action 105 is optional. When included, action 105 typically includes the actions 116. In most embodiments, the actions 116 are repeated through the formation of each of several metal-interconnect layers. Action 105 is shown at this stage in this example because it may provide a source of impurities relevant to subsequent actions 116.

Process 100 continues with action 107, forming an etch stop layer 303, and action 109, forming a dielectric matrix layer 305 providing a structure as shown in FIG. 6. In most embodiments dielectric matrix layer 305 is an inter-level dielectric structure. In other embodiments, all or part of dielectric matrix layer 305 is a sacrificial material that is replaced by dielectric to form the inter-level dielectric structure after a copper interconnect has been formed within the dielectric matrix layer 305. An inter-level dielectric structure is one or more layers of dielectric optionally including one or more etch stop layers.

In most embodiments, dielectric matrix layer 305 is one or more layers of low-k dielectric layers, optionally including an etch stop layer. In some embodiments, one or more of the low-k dielectric layers is an extremely low-k dielectric layer. An extremely low-k dielectric material is generally a low-k dielectric material formed into a porous structure in which porosity reduces the effective dielectric constant of the structure.

Process 100 continues with action 111, patterning matrix layer 305 to form trenches 310 and holes 318 as shown in FIG. 6. Although described and illustrated simply as trenches and holes, trenches 310 and holes 318 can be damascene structures, dual damascene structures, or other patterns etched into dielectric matrix layer 305. Trenches 310 have openings 308 proximate surface 306 of dielectric matrix layer 305. In some embodiments, trenches 310 or holes 318 have a width 312 of 32 nm or less. In some embodiments trenches 310 or holes 318 have a pitch 314 of 64 nm or less.

Figure 7:
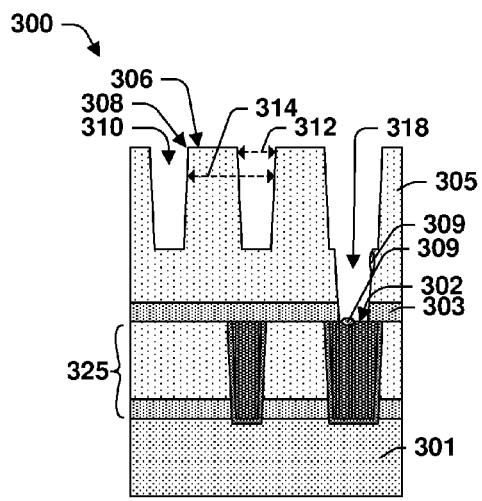

Action 111, patterning matrix layer 305 exposes contacts 302 within interlecel dielectric layer 325 or other structure underlying dielectric matrix layer 305. In most embodiments, action 111 leaves contaminants 309 within trenches 310 or holes 318 as shown in FIG. 7. Contaminates 309 can include CuO and etch byproduct which may included compounds of carbon (C) or fluorine (F). CuO and other copper compounds can form from reactions with Cu contained in metal interconnect layer 325.

Figure 2:
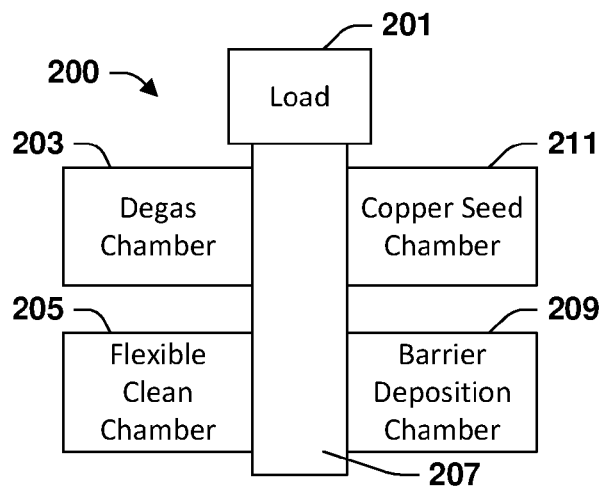
FIG. 2 illustrates a barrier-seed tool in accordance with some embodiments of the present disclosure.

Action 115 is transferring wafer 229 into a barrier-seed tool 200 where actions 116 can are performed in situ. FIG. 2 illustrates a barrier-seed tool 200, which is an example according to another embodiment of the present disclosure. In situ means that actions 116 are all performed without exposing wafer 229 to ambient conditions such as the atmosphere of a manufacturing facility in which barrier-seed layer tool 200 is located.

As illustrated in FIG. 2, barrier-seed tool 200 includes a loading device 201, a degas chamber 203, a clean chamber 205, a barrier layer deposition chamber 209, and a copper seed layer deposition chamber 211. In most embodiments, loading device 201 is configured to load wafers 229 from a wafer cassette (not shown) into barrier-seed tool 200. Central area 207 of barrier-seed tool 200 can be equipped to transport the loaded wafers 229 among the various chambers.

Degas chamber 203 is optional, but included in most embodiments. Degas chamber 203 can be a simple chamber in which wafer 229 can be heated. Barrier layer deposition chamber 209 as a chamber distinct from copper seed layer deposition chamber 211 is also optional, but included in most embodiments. Barrier layer deposition chamber 209 is equipped to deposit a copper diffusion barrier layer by a suitable process. A suitable process can be a chemical vapor deposition (CVD) process, an atomic layer deposition (ALD) process, or a physical vapor deposition (PVD) process. In some embodiments, barrier layer deposition chamber 209 is equipped to deposit a copper diffusion barrier layer by PVD.

Copper seed layer deposition chamber 211 is equipped to deposit a copper seed layer. In some embodiments, copper seed layer deposition chamber 211 is equipped to deposit copper by a PVD process. In some of these embodiments, copper seed layer deposition chamber 211 is supplied with a source of Ar as well as a source of copper. In some embodiments copper seed layer deposition chamber 211 is suitable for etching a copper seed layer.

Figure 4:
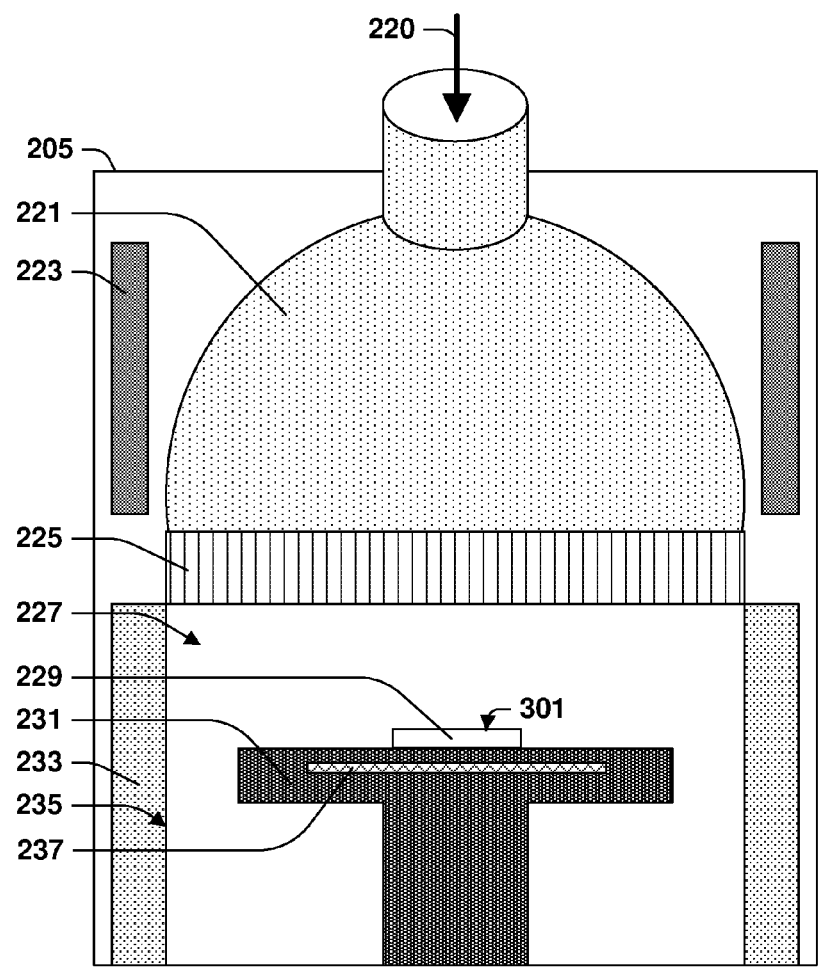
FIG. 4 illustrates a clean chamber that is in accordance with some other embodiments of the present disclosure and is part of the barrier-seed tool of FIG. 2.

FIG. 4 illustrates a clean chamber 205, which is an example according to another embodiment of the present disclosure. Clean chamber 205 includes an upper chamber 221 equipped to generate plasma, a lower chamber 227 in which cleaning takes place, and an ion filter 225 separating the volume enclosed by upper chamber 221 from the volume enclosed by lower chamber 227.

Upper chamber 221 includes a plasma generator. In most embodiments, the plasma generator includes a radio frequency (RF) power source 223. The RF power source 223 can be, for example, a 13.56 MHz source with a capacity up to 500 W. In most embodiments, cleaning chamber 205 is equipped with flow controllers (not shown) for each of the process gases 220. Process gases 220 include all the gases required for the processes performed in cleaning chamber 205. In most embodiments, barrier-seed tool 200 includes a controller for regulating the pressure in upper chamber 221 and throughout clean chamber 205.

Ion filter 225 can be any suitable device that is designed to exclude certain types of ions in upper chamber 221 from entering lower chamber 227. The exclusion is selective according to ion type. Ion filter 225 can operate through electrical or magnetic fields. In most embodiments, ion filter 225 includes a DC power supply having a variable voltage. In some embodiments, the voltage range is a range between ±200V. Ion filter 225 can be set to largely exclude positive ions while permitting the passage of negative ions.

A wafer support 231 is disposed within lower chamber 227 of clean chamber 205. In some embodiments, wafer support 231 is a pedestal. In some embodiments, wafer support 231 includes a heater 237. In some embodiments, the heater 237 is functional to heat a wafer 229 mounted on wafer support 231 to a temperature in a range between 200° C. and 300° C. In some embodiments, a controller is configured to operate the heater 237. In some embodiments, the controller is programmed to maintain the temperature of a wafer 229 mounted on wafer support 231 at a temperature in a range between 200° C. and 300° C.

In some embodiments, the wafer support 231 is connected to an RF coupling that can be used to apply a bias to wafer 229. The bias can be set to attract negative ions to wafer 229. Attracting negative ions to wafer 229 accelerates the ions and increases their energy. Increasing the energy of ions used for bombardment increases the etch rate.

In some embodiments, a heater 233 is positioned adjacent walls 235 of lower chamber 227. In some embodiments, the heater 233 is functional to heat walls 235 to a temperature in a range between 50° C. and 100° C. In some embodiments, a controller is configured to operate the heater 233. In some embodiments, the controller is programmed to maintain the temperature of walls 235 at a temperature in the range between 50° C. and 100° C.

Referring again to FIG. 1, after action 115, process 100 continues with a series of actions 116 that can be performed within the barrier-seed tool 200. The first two of these actions are optional. These are action 117, transferring wafer 229 to degas chamber 203 and action 119, performing a degas operation within degas chamber 203. In most embodiments, a degas operation includes heating wafer 229 to a temperature at which water adsorbed on the surface of wafer 229 desorbs. In some embodiments, degas chamber 203 puts wafer 229 under vacuum, reducing the temperatures at which gases desorb.

Figure 8:
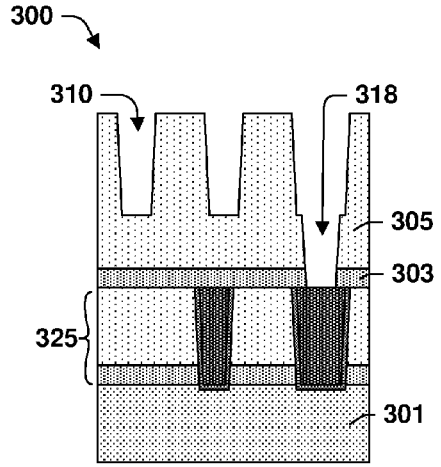

Process 100 continues with action 121, transferring wafer 229 into clean chamber 205. Action 123 is then preformed within clean chamber 205. Action 123 is a cleaning process that is effective for removing contaminants 309 shown in FIG. 7 to provide cleaned trenches 310 and holes 318 as shown in FIG. 8.

The cleaning process of action 123 is a process effective for removing contaminants 309 that include CuO. In most embodiments, the cleaning process is a plasma etch. In some embodiments, action 123 includes supplying upper chamber 221 with gases 220 comprising hydrogen. The cleaning process 123 can proceed through the reaction:

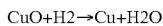

$$CuO+H2 \rightarrow Cu+H2O$$

Figure 9:
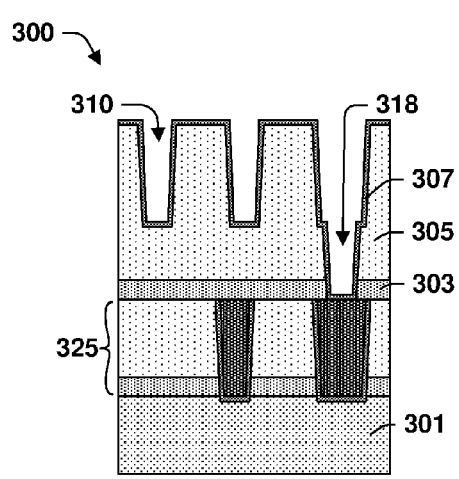

Process 100 continues with action 125, transferring wafer 229 to barrier deposition chamber 209. Action 127 is then performed within barrier deposition chamber 209. Action 127 is depositing a diffusion barrier layer 307 on an upper surface of wafer 229, including surfaces of trenches 310 and holes 318. Diffusion barrier layer 307 lines trenches 310 and holes 318 as shown in FIG. 9. Diffusion barrier layer 307 can include one of more layers having any suitable compositions. Diffusion barrier layer 307 can be for example a layer of Ta, a layer TaN, or a layer of Ta and a layer TaN. Diffusion barrier layer 307 can be deposited by any suitable process. A suitable process can be a CVD process, an ALD process, or a PVD process. In some embodiments, action 127 uses a PVD process.

Figure 10:
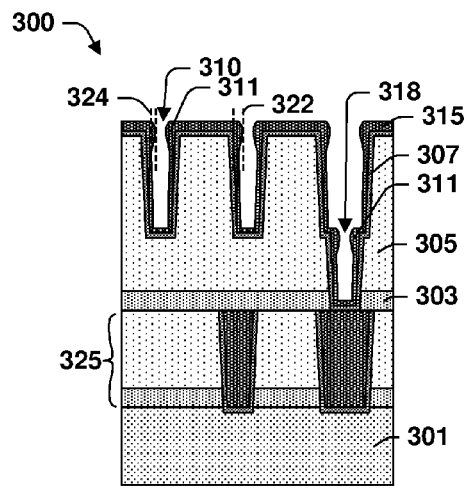

Process 100 continues with action 129, transferring wafer 229 to copper seed deposition chamber 211. Action 131 is then performed within copper seed deposition chamber 211. Action 131 is depositing a copper seed layer 315 over diffusion barrier layer 307 including areas on the surfaces of trenches 310 and holes 318 as shown in FIG. 10. Copper seed layer 315 forms with overhang 311 proximate the openings (mouths) of trenches 310 and of holes 318. Copper seed layer 315 can be deposited by any suitable process. A suitable process can be, for example, a PVD process. In the present disclosure, a PVD process can be any type of PVD process. Examples of PVD processes include, without limitation, sputtering and ionized vaport physical deposition (iPVD).

Figure 11:
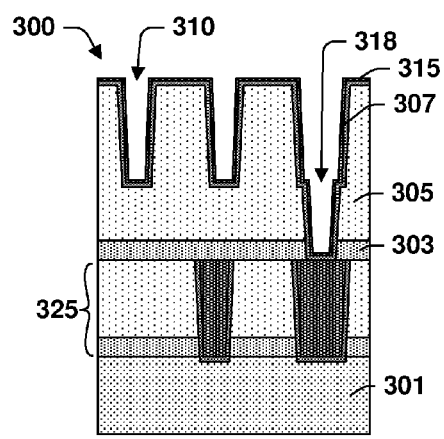
Figure 12:
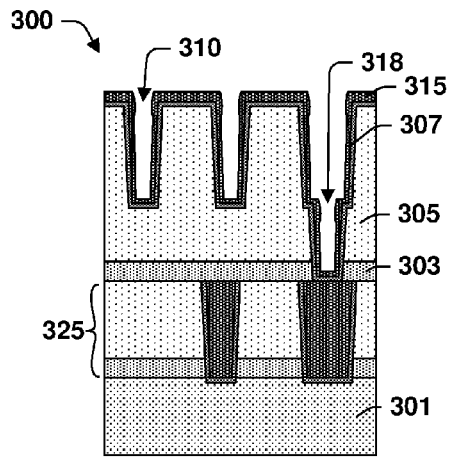

Process 100 continues with action 133, transferring wafer 229 to clean chamber 205. Action 135 is then performed within clean chamber 205. Action 135 is an etch process that selectively removes a portion of copper seed layer 315. The etch is selective for removing portions of copper seed layer 315 forming overhangs 311 over other portions of copper seed layer 315 within trenches 310. The effect of action 135 is to substantially reduce or eliminate overhangs 311 while leaving copper seed layer 315 largely intact within trenches 310 and holes 318 as shown in FIG. 11.

A substantial reduction in overhangs 311 is one sufficient to substantially improve gap fill during subsequent electroplating 141. FIG. 10 identifies a thickness 324, which is the amount by which copper seed layer 315 is thicker adjacent the entrances of trenches 310 (or holes 318) as compared to the thickness of copper seed layer 315 lower down in trenches 310. In some embodiments, thickness 314 is reduced by 30% or more. In some embodiments, a thickness 322 of overhangs 311 is reduced by 50% or more.

Figure 3:
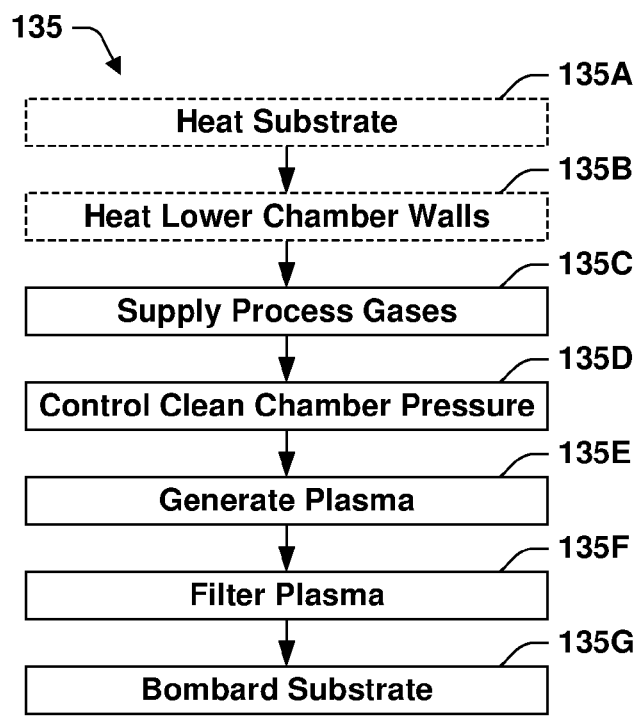
FIG. 3 is a flow chart showing additional details of one of the actions in forming the method of FIG. 1.

As shown in FIG. 3, the etch process of action 135 includes action 135A, heating wafer 229 on wafer support 231, action 135B, heating walls 235 of lower chamber 227, action 135C, supplying upper chamber 221 of clean chamber 205 with process gases 220, action 135D, controlling the pressure within clean chamber 205, action 135E, generating a plasma from process gases 220 in upper chamber 221, action 135F, passing plasma generated in upper chamber 221 and process gases 220 that have not been converted to plasma in upper chamber 221 to lower chamber 227 while filtering to remove some ions from the plasma, and action 135G, bombarding wafer 229 with ions of the filtered plasma.

Action 135A, heating wafer 129 is optional, but most embodiments of process 100 include heating wafer 129 to a temperature within the range between 200° C. and 300° C. In some embodiments, wafer 129 is heated by a heater 237 incorporated with wafer support 231. In some embodiments, wafer 129 is heated before the plasma generation of action 135D begins.

Action 135B, heating walls 235 of lower chamber 227 is also optional. Action 135B can be useful to reduce or eliminate deposition on walls 235 during action 135, etching to reduce overhangs 311. In some embodiments, walls 235 are heated to temperatures in the range between 50° C. and 100° C. In some embodiments, walls 235 are heated by heaters 233 located outside chamber 227.

Action 135C is supplying the process gases 220 used during the etch process of action 135. Process gases 200 include gases for producing a plasma that provides ions that etch overhangs 311. In most embodiments, these gases include halogen compounds. Examples of halogen compounds that can provide source gases for copper-overhang etchants include $Cl_2$, $SiCl_4$, HCl, $BCl_3$, and HBr.

In some embodiments, process gases 220 include one or more gases that provide an oxygen scavenging function (oxygen getters). In some embodiments, N2 is supplied with process gases 200 and functions as an oxygen getter.

In some embodiments, process gases 220 include one or more gases that are functional to passivate surfaces of copper seed layer 315. These passivating compounds can improve selectivity for removing portions of the copper seed layer 315 that form overhang 311 over other portions of copper seed layer 315 within trenches 310 and holes 318. In some embodiments, $NH_3$ is supplied with process gases 220 and functions to passivate surfaces of copper seed layer 315.

Action 135D is controlling the pressure within clean chamber 205. In some embodiments, the pressure is controlled to between 20 mTorr and 300 mTorr. Action 135D can be performed in conjunction with action 135C, supplying process gases 120. Clean chamber 205 includes an exhaust port (not shown). In some embodiments, pressure in clean chamber 205 is measured and the rate of exhaust from chamber 205 is adjusted by a controller in response to the measured pressure in order to maintain the desired pressure.

Action 135E is generating a plasma from process gases 220 in upper chamber 221. In some embodiments, the plasma is generated using RF power source 223. In some embodiments, power source 223 is operated with a power level in the range between 50 and 500 W. The plasma includes halogen ions, such as Cl⁻ and Br⁻. In some embodiments the plasma include Cl ions.

Action 135F is filtering the plasma using ion filter 225 and allowing a filtered portion of the plasma to pass from upper chamber 221 to lower chamber 227. In some embodiments, action 135F includes applying a bias in the range from −10V to −200V to exclude positive ions. In some embodiments, action 135F includes applying a bias in the range from 10V to 200V is used to exclude some of the negative ions. For action 135F, ion filter 225 is set to selectively exclude positive ions over negative ions. In some embodiments, ion filter 225 substantially prevents positive ions generated in upper chamber 221 from passing to lower chamber 227 during the overhang etch of action 135. In some embodiments, ion filter 225 also regulates the flux of negative ions to lower chamber 227.

Action 135G is bombarding wafer 229 with halogen ions to etch and reduce overhangs 311. In some embodiments, the ions are Cl⁻. In some embodiments, the halogen ions have a low energy which is controlled by power source 223. In some of these embodiments, a bias in the range from 10V to 200V is used to exclude some of the halogen ions. The higher the bias, the more ions are filtered and the lower the flux density of the ions bombarding wafer 229. In some embodiments, controlling the ion flux density and controlling the ion energy are used to increase the likelihood that bombarding ions will contact and react with overhangs 311 in comparison to of the likelihood they will contact and react with copper seed layer 315 deeper within trenches 310 or holes 318.

Action 135 removes a significant portion of copper seed layer 315 as shown in FIG. 11, but action 135 concludes and wafer 229 is removed from cleaning chamber 205 before copper seed layer 315 is removed entirely. In some embodiments, copper seed layer 315 remains sufficiently intact that electroplating 141 can begin immediately. In some embodiments, however, wafer 229 is returned to copper seed deposition chamber 211 for additional copper seed layer deposition as shown if FIG. 12. Accordingly, FIG. 1 shows that process 100 includes optional action 137, transferring wafer 129 back to copper seed deposition chamber 211 and optional action 139, depositing a second coating of copper seed layer 315.

Figure 13:
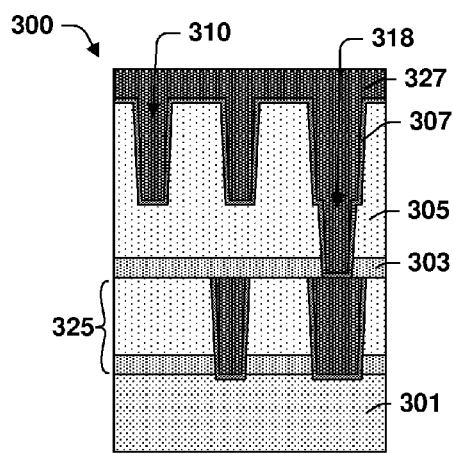
Figure 14:
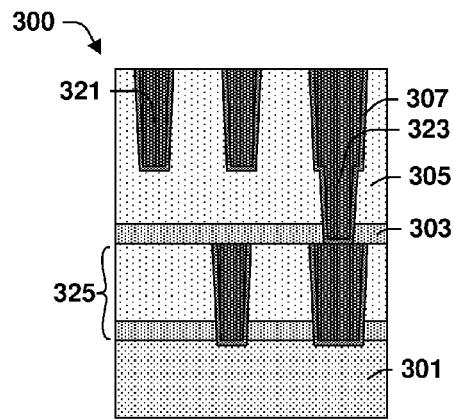

Process 100 continues with action 141, electroplating. Electroplating fills trenches 310 by depositing copper 327 on copper seed layer 315 to fill trenches 310 and holes 318 as shown in FIG. 13. Action 143, chemical mechanical polishing (CMP), removes excess copper 327 to produce conductive lines 321 and vias 323 within inter-level dielectric matrix layer 305 as shown in FIG. 14. Gap fill during electroplating 141 is improved by the overhang etch of action 135. Process 100 concludes with additional process 145 to complete the manufacture of the device 300. In some embodiments, additional processing 145 includes repetition of action 105 through action 141 of process 100. In most embodiments, additional processing 145 includes dicing to form a plurality of devices 300 from a single wafer 229.

The present disclosure provides an integrated circuit device manufacturing process that include forming a dielectric matrix layer over a substrate, forming trenches in the dielectric matrix layer, cleaning the trenches in a first chamber using a plasma comprising ions effective for reducing copper oxide, lining the trenches with a diffusion barrier layer, and forming a copper seed layer over the diffusion barrier layer in a second chamber. The copper seed layer has an overhang proximate the trench openings. The substrate is returned to the first chamber where the overhang is reduced by producing a plasma comprising positively and negatively charged ions including halogen ions, filtering the plasma to selectively exclude positively charged ions, and bombarding the substrate with ions of the filtered plasma. This method can be used to reduce overhangs and improve subsequent gap fill while avoiding excessive damage to the dielectric matrix.

The present disclosure also provides an integrated circuit device manufacturing process that includes loading a wafer into a copper barrier-seed tool including a cleaning chamber and a deposition chamber distinct from the cleaning chamber. Within the cleaning chamber, CuO on a surface of the wafer is reduced. A diffusion barrier layer is then deposited on the surface. Within the deposition chamber, a copper layer is deposited on the diffusion barrier layer. Then, within the cleaning chamber, the copper is etched to remove a significant portion of the copper layer. The wafer is transferred out of the cleaning chamber before the entire first copper layer is removed. This process can be effective for selectively reducing copper overhangs.

The present disclosure provides a copper barrier-seed tool that includes a copper diffusion barrier deposition chamber, a copper seed layer deposition chamber, and a cleaning chamber. The cleaning chamber includes a first volume equipped with a plasma generator, a second volume equipped with a wafer support, and an ion filter separating the first volume from the second volume. The clean chamber can be used to reduce copper overhangs with advantages in comparison to etching to reduce the overhangs in the copper seed deposition chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device manufacturing process, comprising:
   forming a dielectric matrix layer over a substrate;
   forming trenches in the dielectric matrix layer;
   cleaning sidewalls and bottom surfaces of the trenches using a first plasma;
   lining the trenches with a diffusion barrier layer;
   forming a copper seed layer over the diffusion barrier layer, the copper seed layer having an overhang proximate uppermost openings of the trenches; and
   reducing the overhang by:
      producing a precursor plasma comprising positively charged ions and negatively charged ions;
      generating a second plasma by filtering the precursor plasma to selectively exclude the positively charged ions; and
      bombarding the copper seed layer with ions of the second plasma.

2. The process of claim 1, wherein the precursor plasma comprises halogen ions, and wherein bombarding the copper seed layer with ions of the second plasma comprises applying an electric field to accelerate negatively charged ions of the second plasma toward the substrate.

3. The process of claim 2, wherein:
   filtering the precursor plasma to selectively exclude the positively charged ions is accomplished using an ion filter; and applying the electric field to accelerate the negatively charged ions toward the substrate comprises setting a potential difference between the substrate and a portion of the ion filter.

4. The process of claim 3, wherein filtering the precursor plasma comprises providing a DC voltage in a range between 10V and 200V or in a range between −10V and −200V to the ion filter.

5. The process of claim 2, wherein producing the precursor plasma comprises producing low energy halogen ions.

6. The process of claim 1, wherein cleaning the sidewalls and bottom surfaces of the trenches, lining the trenches with the diffusion barrier layer, forming the copper seed layer, and reducing the overhang are all performed in situ within a single tool.

7. The process of claim 1, wherein reducing the overhang comprises passivating the copper seed layer using a gas that improves selectivity for removing portions of the copper seed layer that form a part of the overhang.

8. The process of claim 7, wherein the gas that is functional to passivate the copper seed layer comprises $NH_3$.

9. The process of claim 1, wherein reducing the overhang comprises using a gas that is functional to scavenge oxygen.

10. The process of claim 1, wherein reducing the overhang is carried out at a pressure between 20 mTorr and 300 mTorr.

11. An integrated circuit device manufacturing process, comprising:
receiving a wafer having a dielectric layer over the wafer;
forming a diffusion barrier layer lining a trench in the dielectric layer;
forming a copper seed layer lining the trench over the diffusion barrier layer, wherein the copper seed layer is formed with an overhang region that protrudes from inner sidewalls of the copper seed layer and overhangs the trench at a top of the trench; and
performing a first etch into the copper seed layer to reduce a size of the overhang region;
wherein CuO is present on or over a surface of the wafer prior to forming the diffusion barrier layer.

12. The process of claim 11, wherein performing the first etch comprises producing a plasma, filtering the plasma to selectively exclude ions of the plasma, and bombarding the copper seed layer with ions of the filtered plasma, and wherein the first etch is more selective to the overhang region than to other regions of the copper seed layer.

13. The process of claim 11, wherein reducing the size of the overhang region comprises passivating the copper seed layer using a gas that improves a selectivity for removing portions of the copper seed layer that form a part of the overhang region.

14. The process of claim 13, further comprising:
prior to forming the diffusion barrier layer, loading the wafer into a copper barrier-seed tool comprising a cleaning chamber and a deposition chamber distinct from the cleaning chamber;
within the cleaning chamber, reducing the CuO;
depositing the diffusion barrier layer on the surface of the wafer after the CuO has been reduced;
within the deposition chamber, depositing a first copper layer on the diffusion barrier layer;
within the cleaning chamber, etching to remove a significant portion of the first copper layer, while leaving a remaining portion of the first copper layer in place; and
transferring the wafer out of the cleaning chamber before the entire first copper layer is removed.

15. The process of claim 14, further comprising:
after the etching to remove the significant portion of the first copper layer, transferring the wafer back to the deposition chamber; and
within the deposition chamber, depositing a second copper layer over the remaining portion of the first copper layer.

16. The process of claim 14, wherein the etching to remove the significant portion of the first copper layer comprises:
generating a plasma in a first portion of the cleaning chamber;
etching the first copper layer in a second portion of the cleaning chamber; and
wherein an ion filter separates the first portion of the cleaning chamber from the second portion of the cleaning chamber.

17. The process of claim 16, wherein the etching to remove the significant portion of the first copper layer comprises using the ion filter to exclude positively charged ions.

18. The process of claim 16, wherein the etching to remove the significant portion of the first copper layer comprises supplying the first portion of the cleaning chamber with one or more gases selected from the group consisting of $Cl_2$, $SiCl_4$, HCl, $BCl_3$, and HBr and one or more gases selected from the group consisting of $N_2$ and $NH_3$.

19. An integrated circuit device manufacturing process, comprising:
forming a dielectric layer over a wafer;
forming a trench in the dielectric layer;
forming a diffusion barrier layer lining the trench;
forming a copper seed layer lining the trench over the diffusion barrier layer; and
performing an etch into the copper seed layer, wherein performing the etch comprises:
supplying a process gas to a chamber;
producing a plasma comprising positively charged ions and negatively charged ions from the process gas;
filtering the plasma by applying a bias to an ion filter to selectively exclude the positively charged ions; and
bombarding the copper seed layer with ions of the filtered plasma.

20. The process of claim 19, wherein the process gas is functional to scavenge oxygen.

* * * * *